United States Patent [19]

Sato et al.

[11] Patent Number: 4,744,051
[45] Date of Patent: May 10, 1988

[54] MAGNETIC BUBBLE MEMORY DEVICE

[75] Inventors: Toshihiro Sato, Hachioji; Tadashi Ikeda, Kanagawa; Ryo Suzuki, Hachioji; Teruaki Takeuchi, Kokubunji, all of Japan

[73] Assignee: Hitachi, Ltd., Tokyo, Japan

[21] Appl. No.: 752,587

[22] Filed: Jul. 8, 1985

[30] Foreign Application Priority Data

Jul. 9, 1984 [JP] Japan ............................ 59-140514
Nov. 21, 1984 [JP] Japan ............................ 59-244437
Jan. 16, 1985 [JP] Japan ............................ 60-4058

[51] Int. Cl.$^4$ ............................ G11C 19/08
[52] U.S. Cl. ............................ 365/36
[58] Field of Search ............................ 365/36, 15, 16

[56] References Cited

U.S. PATENT DOCUMENTS 4,415,988 11/1983 Komenou et al. ............. 365/36

Primary Examiner—James W. Moffitt
Attorney, Agent, or Firm—Antonelli, Terry & Wands

[57] ABSTRACT

A magnetic bubble memory device for implementing its high storage density for practical use is generally composed of ion-implanted elements occupying the most part of a minor loop, and other elements made of soft magnetic materials. The ion-implanted minor loop with a higher density is folded several times, and includes straight propagation tracks adjacent to each other and connected by an inside turn, with another straight propagation track having an outside turn facing the inside turn being placed between the adjacent straight tracks.

10 Claims, 12 Drawing Sheets

CRYSTALLINE ORIENTATION OF GARNET FILM (S) SUPER TRACK
(G) GOOD TRACK
(B) BAD TRACK
39 SLANT PROPAGATION TRACK
40 OPENING DIRECTION

FIG. 14A
FIG. 14B
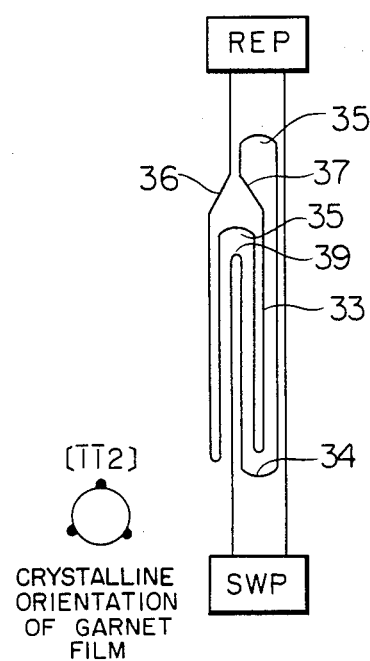
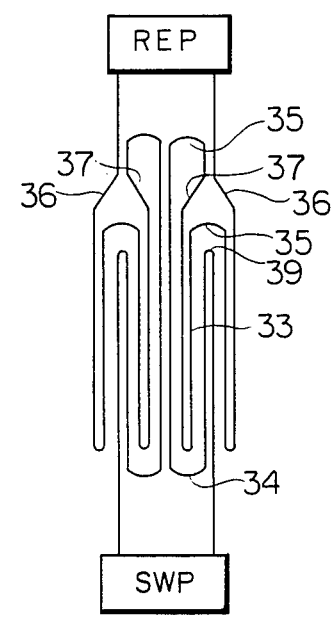

CRYSTALLINE ORIENTATION
OF GARNET FILM

MAGNETIC BUBBLE MEMORY DEVICE

BACKGROUND OF THE INVENTION

This invention relates to magnetic bubble propagation tracks for a magnetic bubble memory device, and more particularly to a magnetic bubble memory having ion-implanted propagation tracks with larger bias field operating margins.

Now, as a system for implementing the high storage density of magnetic bubble memory devices, ion-implanted propagation tracks, which was disclosed in U.S. Pat. No. 3,828,329, are being developed in various places. The ion-implanted tracks can easily be made because of their being gapless, and are suitable for implementing the high density of the device.

On the other hand, the magnetic bubble memory device has such an arrangement as shown in FIG. 1. A generator 1 generates magnetic bubbles, which are driven by a rotating field to be propagated to a major line 2 and further to minor loops 4 via swap gates 3, and the magnetic bubbles, as information, are stored in the minor loops 4. Next, the magnetic bubbles stored in the minor loops 4 propagate to replicators 5 by rotating field drive, and further to a detector 7 via a major line 6 so as to be read out as stored information.

In the magnetic bubble memory device constructed as shown in FIG. 1, however, it is not preferable to form the swap gates, replicators, transfer gates (not shown), etc., which serve to connect the major lines or a major loop with the minor loops, by ion-implanted elements. This is because, if they were made by ion-implanted elements, they would not perform their stabilized function. Thus, it has been proposed to form, with a soft magnetic material as usual, the swap gate, replicators, transfer gates, major lines (or major loops), and the parts of the minor loops in the neighborhood of the connection parts between the major lines (or major loops) and the minor loops, and to form the most parts of the minor loops by ion-implanted elements. The magnetic bubble memory device thus formed is called a "hybrid device". (See Japanese Patent Unexamined Publication No. 57-186,287.)

The details in the neighborhood of each replicator are shown in FIG. 2. In this figure, a major line 9 is made of soft magnetic materials 8, and bubbles are replicated by the current flowing through a conductor 11 arranged below a replicator 10. The part of a minor loop 12, in the neighborhood of the connection part with the major line 9, is made of the soft magnetic material 13, while most of the minor loop 12 is formed by ion-implanted elements 14. Such an arrangement contributes to high storage density of the chip to some extent since most of the minor loops, which occupy the chip of the magnetic bubble memory device for the most part, is formed by ion-implanted elements.

The magnetic bubble memory device as shown in FIGS. 1 and 2, however, does not allow unlimited miniaturization of each element in FIG. 2 in response to the need for the required higher density thereof.

This is because the elements 8, 10 and 13 made of soft magnetic materials, which have relatively larger dimensions, provide limited miniaturization in terms of their fabrication, and so the miniaturization of the ion-implanted elements only cannot meet the demand of the higher density of the device. There is also a limitation for the minimum sizes of the conductors 11, which are arranged below the swap gates, transfer gates and replicators all made of soft magnetic materials, since their electrical resistance must be lower than a predetermined value. Because of the limitation for the minimum sizes of the conductors, etc., the swap gates, transfer gates, and replicators, made of soft magnetic materials, must be of sizes larger than those of propagation paths made of a soft magnetic material.

Further, the miniaturization of the soft magnetic material elements results in reduction of a driving force for bubbles, which also provides a limitation for the minimum sizes thereof.

Since, for the reasons mentioned above, soft magnetic elements 8, 10, 13 and conductor 11 in FIG. 2 cannot be further miniaturized, ion-implanted elements 14 only can be further miniaturized. The miniaturization of only ion-implanted elements 14 can realize the further higher density in the longitudinal direction of FIG. 2. This, however, provides larger gaps between the adjacent minor loops, and so increased wasteful areas on the chip, which is an obstruction against the demand of realizing the higher density of the device.

Such an arrangement as shown in FIG. 3 has been proposed as a magnetic bubble memory device for solving the problem mentioned above. (See Digests of the 6th annual conference on Magnetics in Japan (1982, 11) 15 pD-7 (p. 84).) This, as apparent from the figure, intends to realize the higher density of the device by folding the minor loops a few times to relax the problem mentioned above.

The magnetic bubble memory device as shown in FIG. 3, like FIG. 1, is composed of a generator 1, a major line 2, swap gates 3, folded minor loops 4, replicators 5, a major line 6, and a detector 7. This system of device necessitates inside turns for each minor loop, designated by 20.

FIG. 4 shows an enlarged view of the inside turns, in which bubbles are transferred in the direction of an arrow 21, and are led in the direction of an arrow 22 via inside turn 23. Numeral 24 also designates the same inside turn as 23.

The inventors of this invention investigated the operating bias field margins of the bubbles in the neighborhood of the inside turns 23, 24 and found that they are extremely deteriorated as compared with the operating bias margins of straight propagation tracks 21, 22.

This means that the bubbles cannot stably propagate along the inside turns 23, 24, and so provides a serious problem in putting into the practical magnetic bubble memory devices with the minor loops folded several times.

SUMMARY OF THE INVENTION

An object of this invention is to provide a magnetic bubble memory device having inside turns in the minor loops, which provides a stable operation and high storage density.

The inventors of this invention found that the bubble propagation characteristics at the inside turns mentioned above deteriorate depending greatly on the distance between straight propagation tracks 25 and 26 adjacent to each other as shown in FIG. 6.

Thus, taking notice of the longest distance w of the inside turn, measured in the direction perpendicular to the straight propagation tracks of the minor loop as shown in FIG. 6, the inventors checked the bubble propagation characteristic of each inside turn.

This revealed that, if w/d > 10, where d is the diameter of each bubble, operating margin over 10% can be assured.

This condition, w/d > 10, however, provides a farther distance between straight propagation tracks 25 and 26, increasing the cell size (an area per 1 bit). This is contrary to the goal of implementing the high storage density of the device.

Therefore, for compatibleness of the implementation of the high storage density of the device with the assurance of the necessary operating margin, such a structure as shown in FIG. 7 has been proposed by the inventors. In FIG. 7, 27 is a high density minor loop portion. 28, 31 and 32 are inside turns with wide operating margins. At inside turn 28, the condition w/d > 10 is satisfied by arranging a straight propagation track having an outside turn 29 between two straight propagation tracks constituting the inside turn. At inside turn 32 also, it is satisfied by arranging a straight propagation track having an outside turn 30 in like manner. At inside turn 31, it is satisfied by inclining a part of one straight propagation track.

The feature of the arrangement shown in FIG. 7 resides in that the minor loop (4) includes at least one inside turn (28; 32) of propagation tracks, adjacent straight propagation tracks (51, 53; 52, 54) connected by each of the inside turn (28; 32), and an outside turn (29; 30) another straight propagation track (52; 51), each inserted between the adjacent straight propagation tracks (51, 53; 52, 54).

BRIEF DESCRIPTION OF THE DRAWINGS

FIGS. 14A, 14B and 15A, 15B are views of arrangements of minor loops each with all slant tracks arranged at the side of a replicator in accordance with an embodiment of this invention;

DESCRIPTION OF THE PREFERRED EMBODIMENTS

Embodiment 1

Figure 7:
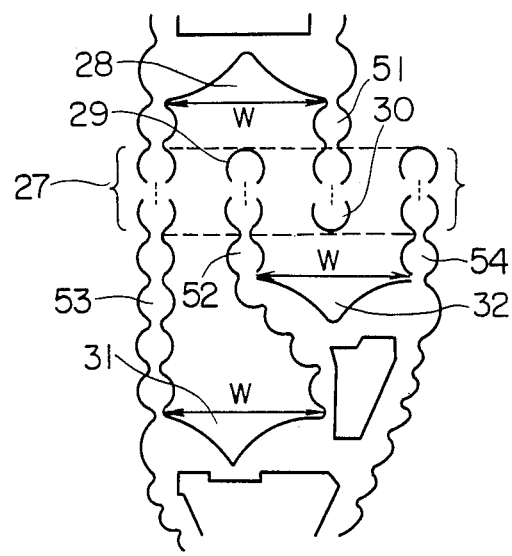
FIG. 7 is a view of an arrangement of a minor loop having straight propagation tracks adjacent to each other connected by each of the inside turns, outside turns of the other straight propagation tracks, each inserted between the adjacent straight tracks, in accordance with this invention.

The inventors of this invention, as mentioned above, proposed the magnetic bubble memory shown in FIG. 7 which provides a higher storage density and allows more stable operation than the conventional one does.

Figures 8A, 8B, 8C:
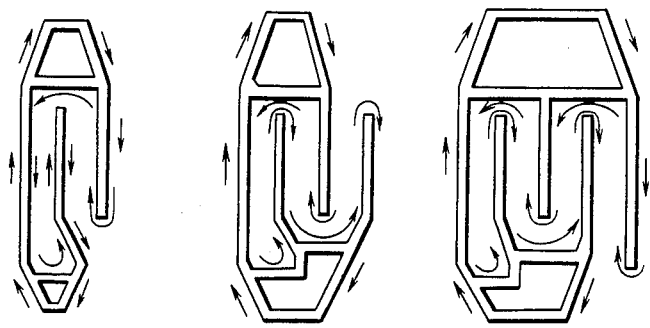
FIGS. 8A, 8B and 8C are views illustrating embodiments of this invention.

As a modification of this, for example, such a minor loop constructed as shown in FIGS. 8A to 8C is now proposed; FIG. 8A shows the ion-implanted track twice folded, FIG. 8B shows one folded three times, and FIG. 8C shows one folded four times. For simplicity of illustration, in these figures, the track is shown as a stripe. Arrows in the figures show an example of the advancing direction of bubbles. In all these cases, the operating margin at the inside turn exceeds 10%, which enabled a magnetic bubble memory device to be realized with a high storage density.

Figures 9A, 9B:
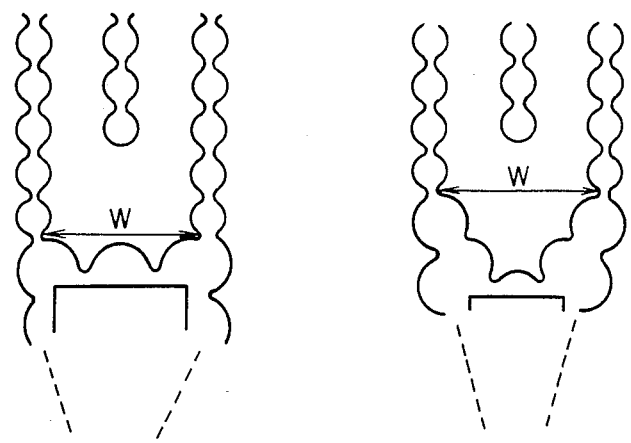
FIGS. 9A and 9B are views illustrating embodiments in which two or more cusps are provided in the inside turn of an ion-implanted propagation track.

FIGS. 9A and 9B show the ion-implanted propagation track having two or more cusps in its inside turn. When such an inside turn was applied to the embodiment shown in FIG. 7, a further better characteristics of the device could be obtained.

The magnetic bubble memory device having the minor loops proposed in the embodiment 1 can provide a higher storage density and allows more stable operation with larger bias margins than the conventional device does.

Embodiment 2

Figure 10:
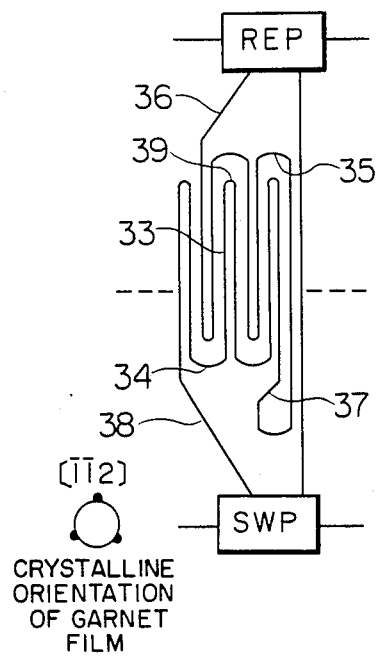
FIG. 10 is a view of an arrangement in the neighborhood of each of the minor loops in accordance with a second embodiment of this invention.

The inventors of this invention fabricated the device having the minor loops shown in FIG. 10 to check several characteristics of the device according to this invention. As seen from FIG. 10, the minor loop includes a straight propagation track 33, inside turns 34 at the side of a swap gate, inside turns 35 at the side of a replication, slant track portions 36, 37, 38 and outside turns 39.

Figure 1:
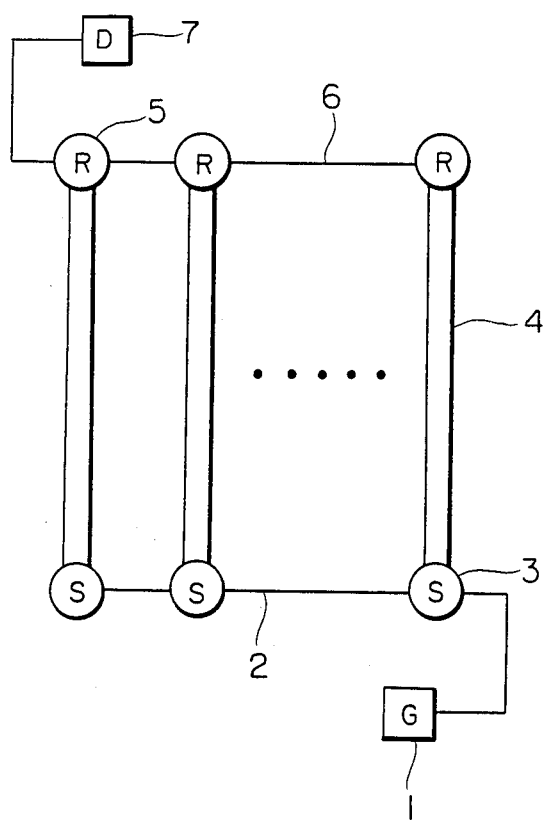
FIG. 1 is a view of a basic arrangement of a magnetic bubble memory device.
Figure 2:
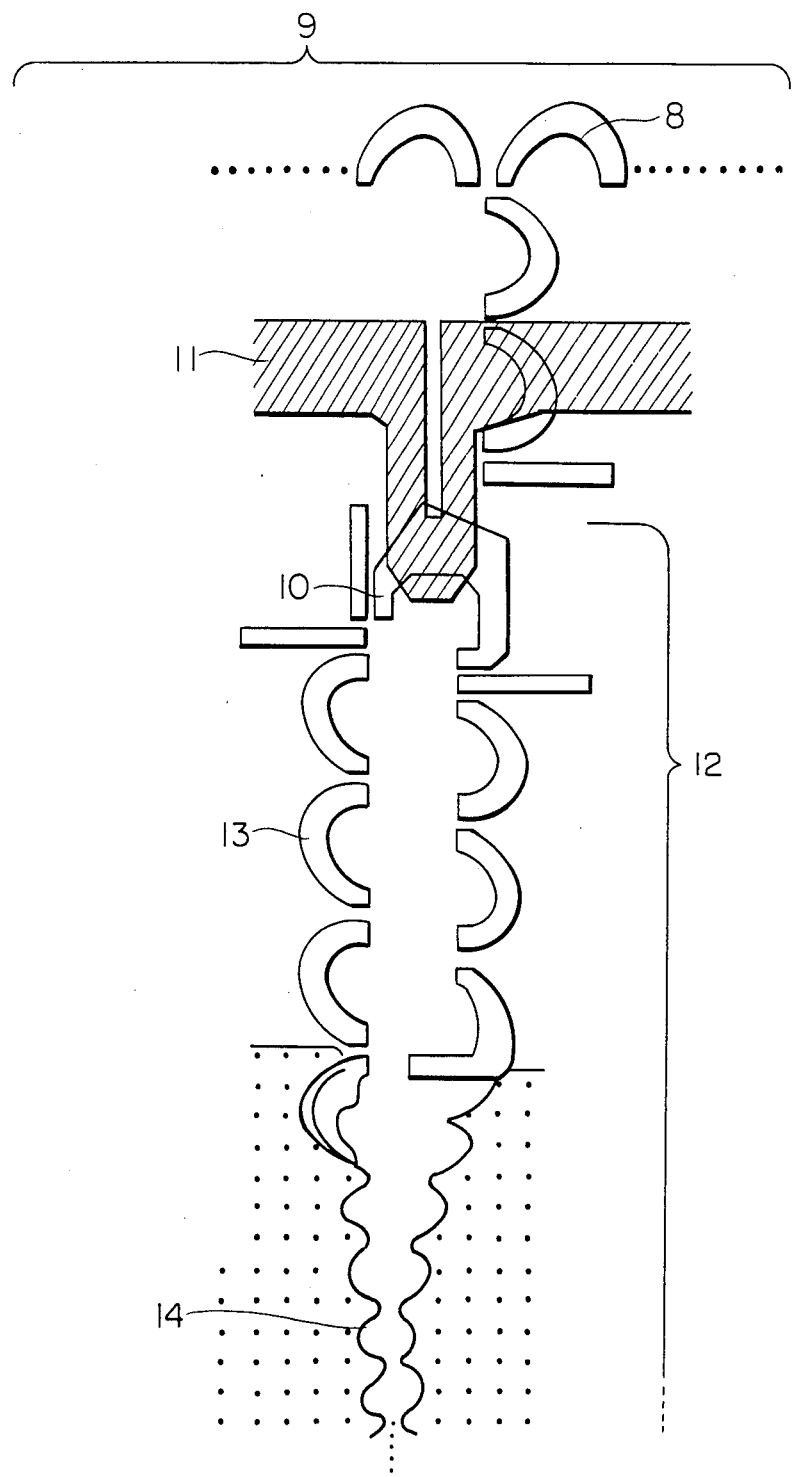
FIG. 2 is a view of an arrangement in the neighborhood of the junction of a hybrid magnetic bubble memory.
Figure 3:
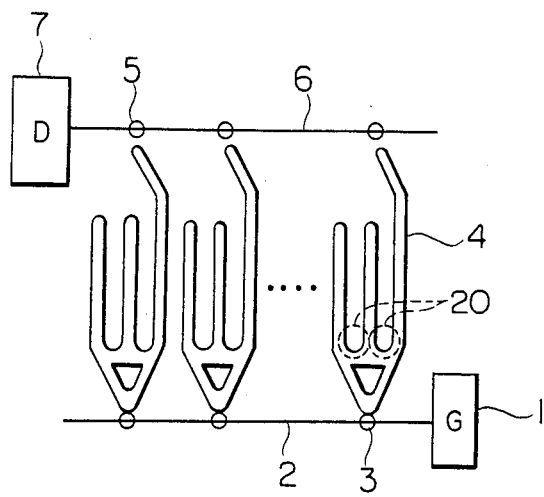
FIG. 3 is a view of a magnetic bubble memory device having folded minor loops.
Figure 4:
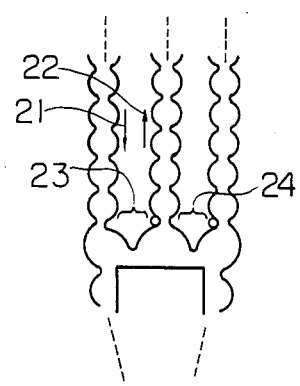
FIG. 4 is a view of an arrangement in the neighborhood of inside turns of each folded minor loop.
Figure 5:
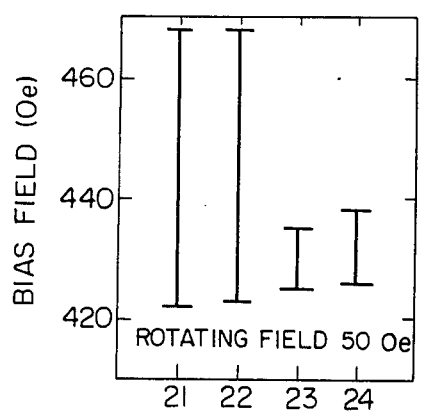
FIG. 5 is a view of the operating bias field margins in the neighborhood of the inside turns.
Figure 6:
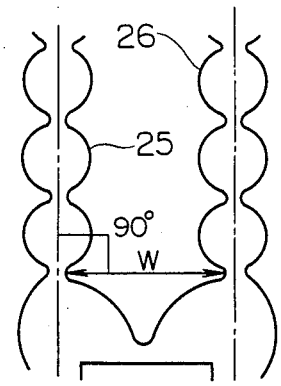
FIG. 6 is a view illustrating the dimension in the neighborhood of the inside turn of the folded minor loop.

Meanwhile, as mentioned above, the magnetic bubble memory device according to this invention, as shown in FIG. 1, is taken as a hybrid device in which replicators, swap gates, etc. are made of soft magnetic materials; conductors are arranged below these replicators, swap gates, etc. These replicators, swap gates, etc., therefore, are larger than the ion-implanted elements in their dimension, and the distances between the adjacent replicators, swap gates, etc. cannot be reduced below predetermined values. On the other hand, in this invention, each minor loop is folded several times for implementation of its high density so that slant tracks 36, 38 necessarily occur as shown in FIG. 10.

Figure 11:
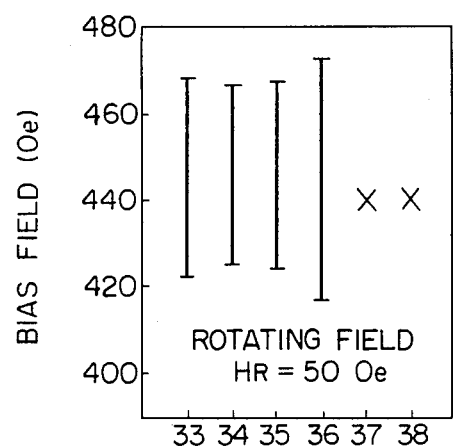
FIG. 11 is a view of bias fields at various portions of the minor loop as shown in FIG. 10.

The inventors used the magnetic bubble memory device having slant portions 36, 37, 38 on the track as shown in FIG. 10 to investigate the propagation characteristics of the bubbles. The results are shown in FIG. 11. This figure shows that good bubble propagation characteristics are obtained at straight track 33, inside turn 34 at the side of the swap gate, inside turn 35 at the side of the replicator, and slant portion 36 at the side of the replicator, oriented in the crystalline orientation of the magnetic bubble garnet film. This figure, however, also shows that the bubbles are not entirely propagated at slant portions 37, 38 at the side of the swap gate, oriented in the orientation opposite to the above crystalline orientation.

Thus, the inventors found that the bubble propagation property at the slant portion in the minor loop propagation track of a high density magnetic bubble memory is closely related with the magnetic anisotropy of a magnetic bubble garnet film.

Figure 12:
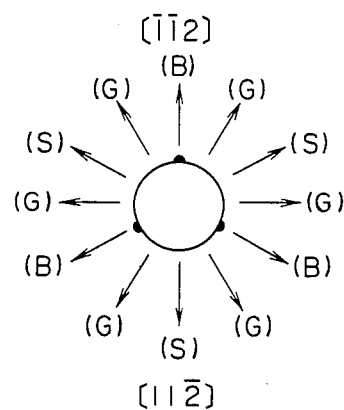
FIGS. 12 and 13 are views illustrating relations between crystalline orientations of a garnet film and bubble operating characteristics of the propagation track.
Figure 13:
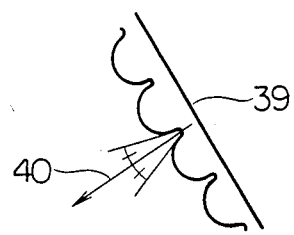

It is known that the bubble propagation property of an ion-implanted bubble propagation track generally depends greatly on the direction of the opening angle 40 of the track, i.e., direction of bisecting the cusps, relative to the crystalline orientation of the garnet film as shown in FIG. 12. The best bubble propagation property appears at the portions having an opening angle in the direction designated by "S" in FIG. 12, which are called super tracks. The second best property appears at the portions having an opening angle in the direction designated by "G", which are called good tracks, and the worst property appears at the portions having an opening angle in the direction designated by "B", which are called bad tracks. The slant tracks 37, 38 shown in FIG. 10 have their opening angle in the same direction as those of the bad tracks mentioned above, and so will have poor bubble propagation properties. Thus, the bubble propagation on these slant tracks can be improved by orienting their opening angle in the same direction as those of the super tracks S or good tracks G.

This invention is based on the principle mentioned above, and is concerned with a magnetic bubble memory device comprising a garnet film supporting magnetic bubbles therein, ion-implanted minor loop propagation tracks for propagating the magnetic bubbles, formed at portions of the garnet film, and means for propagating the produced magnetic bubbles under application of a rotating field, wherein each of said minor loop propagation tracks is an inter-digital one consisting of plural straight tracks, having at least one bubble propagation turn in which one straight track is connected with the adjacent straight track at its end by an inside turn for bubble propagation and forms an outside turn for propagation at its other end; the inside turn and the outside turn are arranged at substantially opposite positions so that the inside turn surrounds the outside turn, and having the straight tracks oriented in the crystalline orientation $[\bar{1}\bar{1}2]$ of the garnet film, or $[\bar{1}2\bar{1}]$ or $[2\bar{1}\bar{1}]$ equivalent thereto, and at least one inside turn connected to a slant portion oriented in the above orientation at the end of the minor loop propagation track. The invention according to this embodiment is also characterized in that the minor loop propagation track has at least one outside turn not surrounded by the inside turn, oriented in the orientation $[11\bar{2}]$ opposite to the crystalline orientation of the garnet film, or $[1\bar{2}1]$ or $[\bar{2}11]$ equivalent thereto at the end of the track.

FIGS. 14A, 14B and FIGS. 15A, 15B show four concrete examples of the minor loop propagation track according to this invention. As seen from these figures, any inside turn connected with slant tracks 37 is arranged at the side of the replicator or replicate gate REP. The replicator is generally oriented in the crystalline orientation $[\bar{1}\bar{1}2]$ of the garnet film, or $[\bar{1}2\bar{1}]$ or $[2\bar{1}\bar{1}]$ equivalent thereto, so that inside turns 35 connected with slant track 37 are also oriented in this orientation to operate the magnetic bubbles with sufficient margins.

The minor loop propagation track according to this embodiment can be equally applied to the magnetic bubble memory device employing transfer gate in place of the replicators and that replacing replicator with swap gate.

Detailed explanation of the four examples shown in FIGS. 14A, 14B and FIGS. 15A, 15B will now be given.

FIG. 14A shows a minor loop by the combination of four straight tracks 33 and three inside turns consisting of two inside turns 35 at the side of the replicator REP and one inside turn 34 at the side of the swap gate. FIG. 14B shows a minor loop by the combination of seven straight tracks 33 and six inside turns consisting of four inside turns 35 at the side of replicator and two inside turns 34 at the side of the swap gate. In both examples, slant tracks 37 following inside turns 35 are arranged at the side of the replicator that is oriented in the crystalline orientation $[\bar{1}\bar{1}2]$ of the garnet film to annihilate any bad track.

Figure 15A:
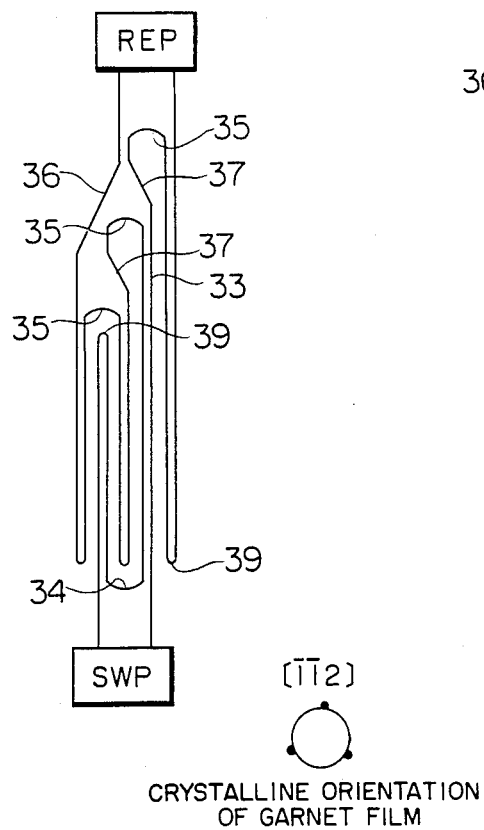
Figure 15B:
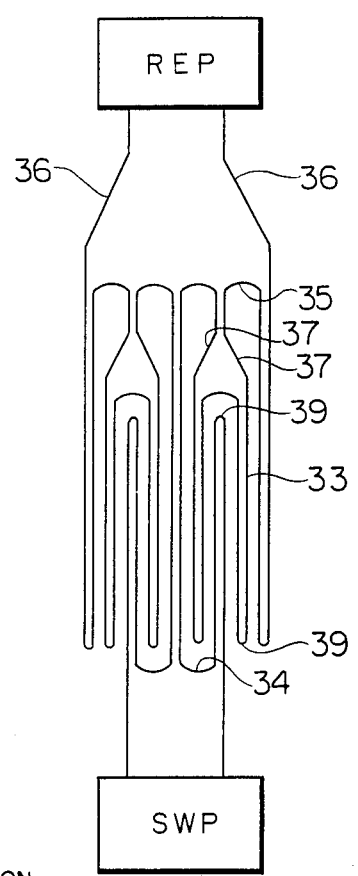
Figure 16:
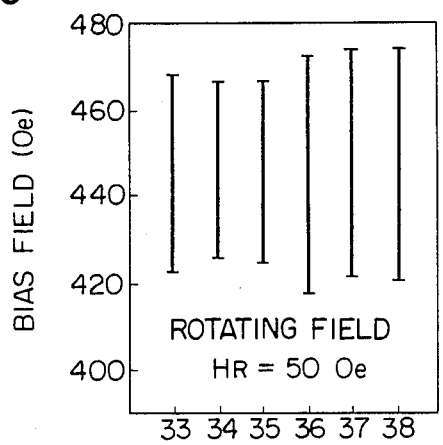
FIG. 16 is a graph illustrating operating bias field margins at various portions in accordance with the second embodiment of this invention.

FIGS. 15A and 15B show other examples of this embodiment. FIG. 15A shows a minor loop by the combination of five straight tracks 33 and four inside turns consisting of three inside turns 35 at the side of the replicator and one inside turn 34 at the side of the swap gate. FIG. 15B shows a minor loop by the combination of nine straight tracks 33 and eight inside turns consisting of six inside turns 35 at the side of the replicator and two inside turns 34 a the side of the swap gate. In both examples, slant tracks 37 following inside turns 35 are arranged at the replicator to annihilate any bad track. An ion-implanted bubble propagation track with bubbles of 0.8 $\mu m\phi$ and a cell size of 3 $\mu m \times 3$ $\mu m$ was actually applied to the minor loops shown in the above examples to test the bubble propagation property. This test revealed that any minor loop with the slant tracks following inside turns being arranged at the side of the replicator provides an operating bias field margin increased over 12% to improve the bubble propagation characteristics. The results are shown in FIG. 16. The similar effect was recognized for the ion-implanted bubble propagation track with magnetic bubbles of 0.5 $\mu m\phi$ and a cell size of 1.8 $\mu m \times 2.0$ $\mu m$.

Embodiment 3

Figure 17:
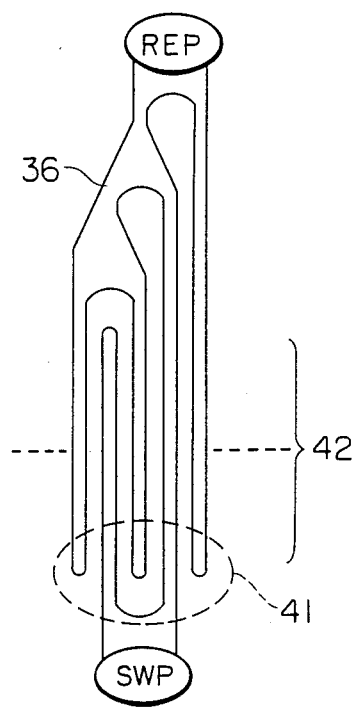
FIG. 17 is a view of an arrangement of a minor loop with all slant tracks arranged at the side of a replicator in accordance with the third embodiment of this invention.

In the minor loop such as shown in FIG. 17 in accordance with this invention, necessarily occur a portion where the adjacent propagation tracks are close to each other as shown by 42 in the figure (hereinafter referred to as fundamental straight tracks) and a portion where they are comparatively far from each other as shown by 41 (hereinafter referred to as isolated tracks).

Figure 18:
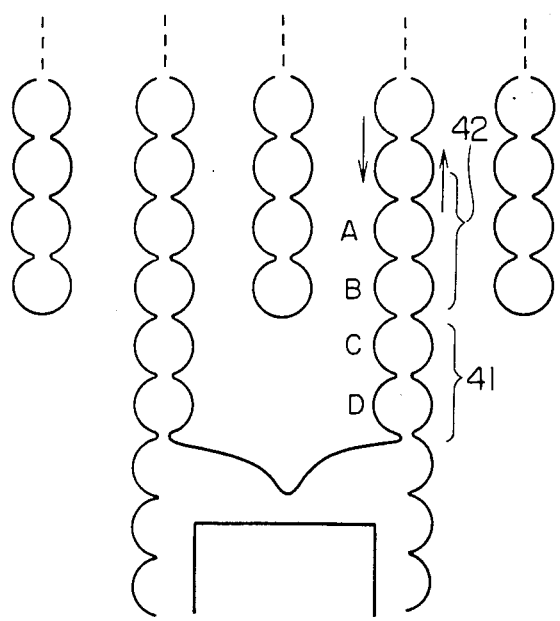
FIG. 18 is a view illustrating fundamental straight tracks and isolated tracks in the neighborhood of the inside turn in accordance with the third embodiment of this invention.

FIG. 18 is an enlarged detail in the neighborhood of isolated track 41 shown in FIG. 17. In this figure points C and D in the neighborhood of an inside turn form an isolated track, and points A and B form a fundamental straight track. The isolated track necessarily occurs also in the neighborhood of slant tracks 36 as well as in the neighborhood of the inside turns.

The inventors measured the operating bias field margins at various portions of the minor loop according to this invention. This measurement showed that the fundamental straight track and the isolated track differ from each other in their operating bias field margins. This reduces a common operating bias field margin 43 of the whole loop, thereby correspondingly hindering the operation of the magnetic bubble memory device.

Figure 19:
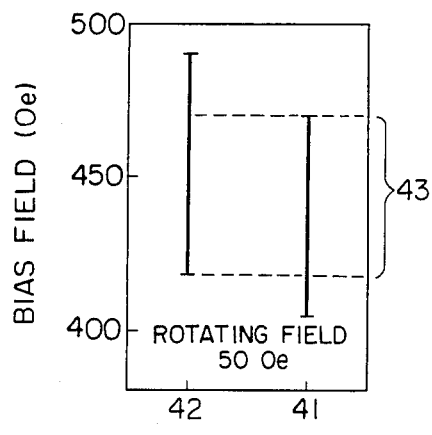
FIG. 19 is a graph illustrating operating bias field margins at the fundamental straight track and the isolated track.

The inventors investigated through the measurement of bubble potentials why, in the ion-implanted propagation, the isolated track 41 is shifted from the fundamental straight track 42 in their operating margins as shown in FIG. 19. The bubble potential means strength of bubble attractive magnetic poles produced in the propagation track, evaluated relative to measured collapse fields of bubbles. The negative bubble potential with its absolute value being larger means the stronger bubble attractive magnetic pole in the propagation track.

Figure 20:
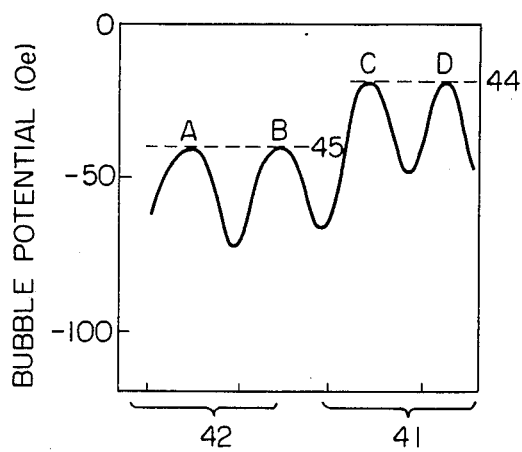
FIG. 20 is a graph illustrating bubble potentials at the fundamental straight track and the isolated track.

FIG. 20 is a graph showing the change of the bubble potential at the points 42 and 41 on the ion-implanted propagation track. While on the propagation track the bubble propagates along the track section from one concave portion to the subsequent concave portion, which corresponds to one bit of the memory, via the intermediate convex portion, the bubble potential also changes in a concave and convex manner as shown in FIG. 20. The letters A, B, C, and D designated in FIG. 20 correspond to the points A, B, C, and D at the convex portions of the propagation track with a fixed period, shown in FIG. 18. FIG. 20 shows that the highest bubble potential 44 (i.e. weakest attractive magnetic pole) at the isolated track is higher than the corresponding potential 45 at the fundamental straight track by about 20 Oe. In this way, with the propagation track of a fixed period, the isolated track may provide higher bubble potentials because of the absence of influence by anti-magnetic field or the like which occurs between this isolated track and the track adjacent thereto.

The operating bias field margin at the isolated track is shifted towards the lower bias field as shown in FIG. 19 since the bubble potential at C and D is higher than that at A and B and the bubbles are likely to collapse at the operating bias field margin over that at A and B.

Figure 21:
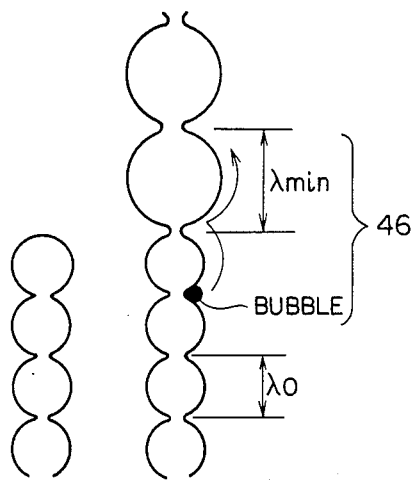
FIG. 21 is a plan view illustrating parameters in the neighborhood of the isolated track.
Figure 22:
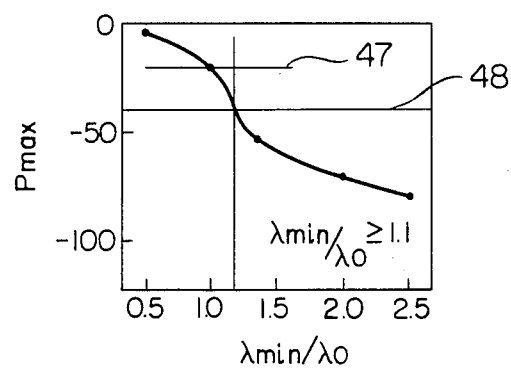
FIG. 22 is a graph showing relations between a ratio of a bit period in the track, $\lambda_{min}/\lambda_o$ and a value of the bubble potential, $P_{max}$.
Figure 23:
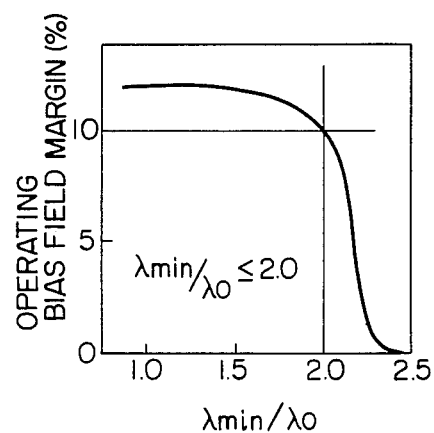
FIG. 23 is a graph showing relations between a ratio of a bit period in the track, $\lambda_{min}/\lambda_o$ and the bias field margin.

In order to adjust the operating bias field margin of the isolated track with that of the fundamental straight track, it is necessary to lower the bubble potential (i.e. strengthen the magnetic pole) at C and D by some method. To this end, checked were the relation between the ratio $\lambda_{min}/\lambda_o$ in FIG. 21 (where $\lambda_{min}$ is the minimum period of the isolated track and $\lambda_o$ is the period of the fundamental straight track) and the highest bubble potential $P_{max}$. The measurement results are shown in FIG. 22. As seen from the figure, when $\lambda_{min}/\lambda_o$ is 1.1 or more, the bubble potential is less than that at 45 designated in FIG. 20. On the other hand, with the fundamental straight track of period $\lambda_o$ and the isolated track of period $\lambda_{min}$ being connected, the propagation characteristic of the connection part or junction (46 in FIG. 21) was measured using $\lambda_m/\lambda_o$ as a parameter. The measurement results are shown in the graph of FIG. 23, the abscissa of which indicates the value of $\lambda_{min}/\lambda_o$, and the ordinate of which indicates an operating bias field margin permitting the operation that is the percent of the operating bias field margin relative to its center field. To operate the memory device with high reliability, the bias field margin must be 10% or more. This condition is satisfied by the range of ratio $\lambda_{min}/\lambda_o \leq 2.0$. Thus, considering the condition of the bubble potential shown in FIG. 22, the period $\lambda$ of the isolated track, closest to the fundamental straight track must be:

$$1.1 \leq \lambda_{min}/\lambda_o \leq 2.0$$

Some modifications of this embodiment will now be given.

Figure 24:
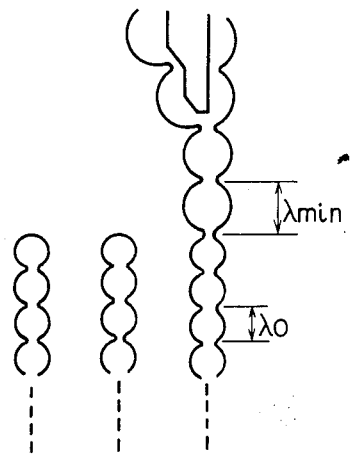
FIGS. 24 to 27 are views of the fundamental straight track and isolated track with their bit period changed in accordance with still further embodiment of this invention.
Figure 25:
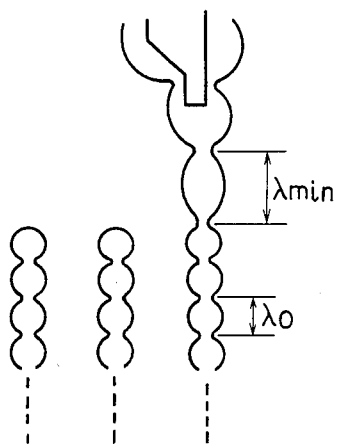
Figure 26:
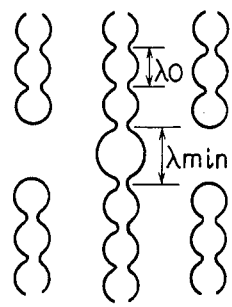
Figure 27:
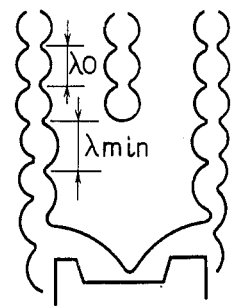

FIG. 24 shows the case where the period $\lambda_o$ of the fundamental straight track is 3 μm and the period $\lambda_{min}$ of the isolated track is 3.5 μm. FIG. 25 shows the case where with $\lambda_o$ being 3 μm and $\lambda_{min}$ being 5 μm, the isolated track is relatively flattened in its shape. FIGS. 26 and 27 show the cases where the isolated track is provided individually inside the fundamental straight track; FIG. 26 shows the case where with $\lambda_o$ being 2 μm and with $\lambda_{min}$ being 3 μm, the isolated track is surrounded by four outside turns, and FIG. 27 shows the case where with $\lambda_o$ being 1.8 μm and with $\lambda_{min}$ being 2.0 μm, the isolated track is provided in the neighborhood of an inside turn. In any case of these four cases, the isolated track satisfying the condition $1.1 \leq \lambda_{min}/\lambda_o \leq 2.0$ is arranged adjacently to the fundamental straight track to prevent the deterioration of the operating property and provide a common operating bias field margin of 10% or more.

In accordance with this embodiment, in the magnetic bubble memory device using ion-implanted propagation tracks, isolated tracks having a good characteristic can be provided, which greatly contributes to the high reliability of the memory device.

As apparent from the above description, in accordance with this invention a magnetic bubble memory device implanting both the high storage density and sufficient operating margin can be provided.

We claim:
1. A magnetic bubble memory device comprising:
   a minor loop for storing information therein, said minor loop being formed by implanting ions in a desired portion of a magnetic film for magnetic bubbles, said minor loop comprising at least one inside turn of a propagation track, straight propagation tracks adjacent to each other being connected by said at least one inside turn, at least one outside turn of another straight propagation track being disposed between said connected adjacent straight propagation tracks so as to face said at least one inside turn;
   a major line or loop for reading or writing information; and
   a connecting portion between said minor loop and said major line or loop.

2. A magnetic bubble memory device according to claim 1, wherein said connecting portion includes a slant track between said adjacent straight propagation tracks.

3. A magnetic bubble memory device according to claim 1, wherein said adjacent straight propagation tracks and said at least one inside turn are connected by a slant track.

4. A magnetic bubble memory device according to claim 3, wherein said adjacent straight propagation tracks are arranged in a $[\bar{1}12]$, $[\bar{1}2\bar{1}]$ or $[2\bar{1}\bar{1}]$ orientation that is the crystalline orientation of said magnetic film, an said inside turn connected with said slant track is connected at the side of the end of said $[\bar{1}12]$, $[\bar{1}2\bar{1}]$ or $[2\bar{1}\bar{1}]$ orientation.

5. A magnetic bubble memory device according to claim 4, wherein said connecting portion is formed by a replicator, and said replicator is arranged at the side of the end of said $[\bar{1}12]$, $[\bar{1}2\bar{1}]$ or $[2\bar{1}\bar{1}]$, orientation where said adjacent straight propagation tracks are arranged.

6. A magnetic bubble memory device according to claim 5, wherein said replicator and said adjacent propagation tracks are connected by said slant track.

7. A magnetic bubble memory device according to claim 1, wherein $w/d > 10$, where w is the longest distance between the adjacent straight propagation tracks connected with said inside turn, when measured in the direction perpendicular to the axes of the straight propagation tracks, and d is the diameter of the magnetic bubble.

8. A magnetic bubble memory device according to claim 7, wherein said minor loop is formed by a fundamental straight propagation track and an isolated track, and the period $\lambda_o$ of the fundamental straight propagation track and the minimum period $\lambda$ of the isolated track satisfy the condition, $1.1 \leq \lambda/\lambda_o \leq 2.0$.

9. A magnetic bubble memory device according to claim 1, wherein said another straight propagation track having said outside turn is disposed between said connected adjacent straight propagation tracks so that portions of said another straight propagation track face opposing portions of said connected adjacent straight propagation tracks.

10. A magnetic bubble memory device according to claim 1, wherein said connected adjacent straight propagation tracks are connected by a plurality of inside turns without a further straight propagation path being arranged between and connected to said plurality of inside turns.

* * * * *